United States Patent
Liu et al.

(10) Patent No.: US 8,749,120 B2
(45) Date of Patent: Jun. 10, 2014

(54) FLEXIBLE MICRO BUMPS OPERABLY COUPLED TO AN ARRAY OF NANO-PIEZOELECTRIC SENSORS

(75) Inventors: Weihua Liu, Xi'an Shanxi (CN); Hongzhong Liu, Shanxi (CN); Xin Li, Shanxi (CN)

(73) Assignee: Xi'an Jiaotong University, Xi'an, Shanxi (CN)

( * ) Notice: Subject to any disclaimer, the term of this patent is extended or adjusted under 35 U.S.C. 154(b) by 0 days.

(21) Appl. No.: 13/580,945

(22) PCT Filed: Oct. 28, 2011

(86) PCT No.: PCT/CN2011/081501
§ 371 (c)(1), (2), (4) Date: Aug. 23, 2012

(87) PCT Pub. No.: WO2013/060021
PCT Pub. Date: May 2, 2013

(65) Prior Publication Data
US 2013/0106244 A1    May 2, 2013

(51) Int. Cl.
*H01L 41/113*   (2006.01)
*H01L 41/047*   (2006.01)
*H01L 41/18*    (2006.01)
*H01L 41/053*   (2006.01)
*H01L 41/22*    (2013.01)
*H04R 17/00*    (2006.01)

(52) U.S. Cl.
USPC ........... 310/338; 310/328; 310/334; 310/339; 310/366; 29/25.35

(58) Field of Classification Search
USPC .......... 310/328, 334, 338, 339, 366; 29/25.35
See application file for complete search history.

(56) References Cited

U.S. PATENT DOCUMENTS

| | | | | |
|---|---|---|---|---|
| 5,375,099 | A * | 12/1994 | Gill | 367/140 |
| 8,304,759 | B2 * | 11/2012 | Dutta | 257/21 |
| 8,354,776 | B2 * | 1/2013 | Choi et al. | 310/339 |
| 2010/0066208 | A1 * | 3/2010 | Choi et al. | 310/339 |
| 2010/0117488 | A1 * | 5/2010 | Wang et al. | 310/339 |
| 2011/0163636 | A1 * | 7/2011 | Sirbuly et al. | 310/339 |
| 2011/0217519 | A1 | 9/2011 | Sakashita | |
| 2012/0235541 | A1 * | 9/2012 | Pinkerton | 310/339 |
| 2012/0293047 | A1 * | 11/2012 | Wang et al. | 310/339 |
| 2013/0175901 | A1 * | 7/2013 | Cha et al. | 310/339 |

FOREIGN PATENT DOCUMENTS

| | | |
|---|---|---|
| CN | 1796952 A | 7/2006 |
| CN | 101776495 A | 7/2010 |

OTHER PUBLICATIONS

Xu, Sheng, et al., Optimizing and improving the growth quality of ZnO nano-wire arrays guided by statistical design of experiments, ACS Nano 3, 2009, pp. 1803-1812.

Qin, Yong, et al., Growth of horizontal ZnO nano-wire arrays on any substrate, Journal of Physical Chemistry C, vol. 112, 2008, pp. 18734-18736.

Zhu, Guang, Flexible High-Output Nanogenerator based on lateral ZnO nanowire array, Nano Letters, vol. 10, 2010, pp. 3151-3155.

(Continued)

*Primary Examiner* — Thomas Dougherty

(57) ABSTRACT

Implementations and techniques for manufacturing flexible micro bumps operably coupled to an array of nano-piezoelectric sensors are generally disclosed. The micro bumps and coupled nano-piezoelectric device have use at least as tactile sensors. A wide variety of configurations of the micro bumps and the nano-piezoelectric device are anticipated.

21 Claims, 19 Drawing Sheets

(56) References Cited

OTHER PUBLICATIONS

Fan, Z. et al., Towards the development of printable nano-wire electronics and sensors, Advanced Materials, vol. 21, 2009, pp. 3730-3743.
Fan, Zhiyong, et al., Wafer-scale assembly of highly ordered semiconductor nano-wire arrays by contact printing, Nano Letters, vol. 8, 2008, pp. 20-25.
Yang, R., et al., Characteristics of output voltage and current of integrated nanogenerators, Applied Physics Letters, vol. 94, 2009, p. 022905.
Yang, R., et al., Power generation with laterally packaged piezoelectric fine wires, Nature Nanotechnology, vol. 4, 2009, pp. 34-39.
Zhou, J., et al., Flexible piezotronic strain sensor, Nano Letters, vol. 8, 2008, pp. 3035-3040.
Zhou, J., et al., Piezoelectric-potential-controlled polarity-reversible Schottky diodes and switches of ZnO wires, Nano Letters, vol. 8, 2008, pp. 113973-113977.
Zhou, J., Mechanical-Electrical triggers and sensors using piezoelectric microwires/nano-wires, Nano Letters, vol. 8, 2008, pp. 2725-2730.
Eltaib, M.E.H., et al., Tactile sensing technology for minimal access surgery—a review, Mechatronics, vol. 13, 2003, pp. 1163-1177.
Ohka, M., et al., Sensing characteristics of an optical three-axis tactile sensor mounted on a multi-fingered robotic hand, in Proceedings of the 2005 IEEE/RSQ International Conference on Intelligent Robots and Systems, 2005, pp. 1959-1964.
Futai, N., et al., A flexible micromachined planar inductor for use as an artificial tactile mechanoreceptor, Sensors and Actuators A, vol. 111, 2004, pp. 293-303.
Kolesar, Jr., E., et al., Object imaging with a piezoelectric robotic tactile sensor, Journal of Microelectromechanical Systems, vol. 4, 1995, pp. 87-96.
Kärki, S., et al., Development of a piezoelectric polymer film sensor for plantar normal, and shear stress measurements, Sensors and Actuators A, vol. 154, 2009, pp. 57-64.
Sergio, M., et al., A textile based capacitive pressure sensor, Proceedings of IEEE Sensors, vol. 2, 2002, pp. 1625-1630.
Lee, Hyung-Kew, et al., A flexible polymer tactile sensor: fabrication and modular expandability for large area deployment, Journal of Microelectromechanical Systems, vol. 15, 2006, pp. 1681-1685.
Hussain, M., et al., Conductive rubber materials for pressure sensors, Journal of Material Science Letters, vol. 20, 2001, pp. 525-527.
Shimojo, M., et al., A tactile sensor sheet using pressure conductive rubber with electrical-wires stitched method, IEEE Sensors Journal., vol. 4, 2004, pp. 589-596.
Someya, T., et al., A large-area, flexible pressure sensor matrix with organic field-effect transistors for artificial skin applications, Proceedings of the National Academy of Sciences, vol. 101, 2004, pp. 9966-9970.
Takei, K., et al., Nano-wire active-matrix circuitry for low-voltage macroscale artificial skin, Nature Materials, vol. 9, 2010, pp. 821-826.
Mannsfeld, S., et al., Highly sensitive flexible pressure sensors with microstructure rubber dielectric layers, Nature Materials, vol. 9, 2010, pp. 859-864.
Wang, Z. L., et al., Piezoelectric nanogenerators based on Zinc Oxide nano-wire arrays, Science, vol. 312, 2006, pp. 242-246.
Qin, Y. et al., Microfibre-nano-wire hybrid structure for energy scavenging, Nature, vol. 451, 2008, pp. 809-813.
Liu, Weihua, et al., Piezopotential gated nano-wire-nanotube hybrid field-effect transistor, Nano Letters, vol. 10, 2010, pp. 3084-3089.
Wettels, N., et al., Biomimetic tactile sensor array, Advanced Robotics, vol. 22, 2008, pp. 829-849, Koninklijke Brill NV, Leiden and the Robotics Society of Japan.
Landau, Elizabeth, Fingerprint study offers inspiration for robotics research, accessed online on Aug. 21, 2012 via http://edition.cnn.com/2009/HEALTH/02/03/fingerprints.study/index.html.
Hill, Kimberly, E-Skin for robots could lead to touch-feel prosthetics for humans, Tech News World, Sep. 14, 2010, accessed online on Aug. 21, 2012 via http://www.technewsworld.com/story/70808.html.
Shirinov, A.V., et al., Pressure sensor from a PVDF film, Sensors and Actuators A: Physical, vol. 142, issue 1, Mar. 10, 2008, pp. 48-55, Elsevier.
The State Intellectual Property Office, The P.R. China, International Search Report and Written Opinion of the International Searching Authority for PCT/CN2011/081501, mailed on Aug. 2, 2012, China.
Palmer, J., "Sensitive touch for 'robot skin'," accessed at http://web.archive.org/web/20100913155545/http://www.bbc.co.uk/news/technology-11265415, last updated on Sep. 13, 2010, accessed on Aug. 27, 2013, pp. 1-3.

* cited by examiner

1800 A computer program product.

1802 A signal bearing medium.

1804 Machine-readable instructions, which, if executed by one or more processors, operatively enable a computing device to:

deposit a plurality of bottom electrodes on a flexible substrate, wherein the deposited plurality of bottom electrodes have a substantially parallel pattern;

deposit a plurality of nano-piezoelectric wires on the flexible substrate, wherein the deposited plurality of nano-piezoelectric wires have a substantially checkerboard pattern;

deposit a plurality of top electrodes such that the plurality of top electrodes are electrically coupled to the plurality of nano-piezoelectric wires to form an array of nano-piezoelectric sensors, wherein the deposited plurality of top electrodes have a substantially parallel pattern; and/or deposit a plurality of flexible micro bumps on the array of nano-piezoelectric sensors, wherein the plurality of flexible micro bumps are operable coupled to the array of nano-piezoelectric sensors.

| 1806 a computer-readable medium. | 1808 a recordable medium. | 1810 a communications medium. |

FIG. 18

FLEXIBLE MICRO BUMPS OPERABLY COUPLED TO AN ARRAY OF NANO-PIEZOELECTRIC SENSORS

RELATED APPLICATION

This application is a 371 national stage entry of International Application No. PCT/CN11/81501, filed on Oct. 28, 2011 which is hereby incorporated by reference in its entirety.

BACKGROUND

Unless otherwise indicated herein, the approaches described in this section are not prior art to the claims in this application and are not admitted to be prior art by inclusion in this section.

Compared with a visual identity and an audio identity, a tactile identity may be relatively difficult to achieve. Research on the tactile element has been occurring over the past thirty years, but tactile element development is, in many cases, still far behind the development of visual elements and audio elements. On the one hand, the tactile sensation contains a lot of physical information, such as shock, pressure (vertical and tangential), the shape or pressure distribution in the minimal area, and the temperature. On the other hand, inflexible the tactile devices may not function for a wide variety of applications.

For example, it has been a problem in bionics to mimic the human sense of touch using tactile sensors. In fact, the human sense of touch contains a lot of physical information. Such physical information may include heat transfer, pressure and/or friction. In some cases, it may be useful for a robot to be able to pick up a tea cup steadily without breaking it. In other cases, it may be useful for a robot to be able to pick up an egg without crushing it. Such robotic operations may entail the robot obtaining tactile information, so as to judge the kind of the object and adjust the grip to pick up the object.

SUMMARY

Some example apparatus and systems may relate to nano-piezoelectric sensors. Such an apparatus may include a flexible substrate, an array of nano-piezoelectric sensors, and/or a multiple number of flexible micro bumps. Such an array of nano-piezoelectric sensors may be coupled to the flexible substrate, where the array of nano-piezoelectric sensors may include a layer of nano-piezoelectric wires. The multiple number of flexible micro bumps may be operably coupled to the array of nano-piezoelectric sensors.

Some example methods for manufacturing tactile devices may include forming a multiple number of nano-piezoelectric sensors. Such methods may include depositing a multiple number of bottom electrodes on a flexible substrate, where the deposited bottom electrodes may have a substantially parallel pattern. A multiple number of nano-piezoelectric wires may be deposited on the flexible substrate, where the deposited multiple number of nano-piezoelectric wires may have a substantially checkerboard pattern. A multiple number of top electrodes may be deposited such that the multiple number of top electrodes are electrically coupled to the multiple number of nano-piezoelectric wires to form an array of nano-piezoelectric sensors, where the deposited multiple number of top electrodes may have a substantially parallel pattern. A multiple number of flexible micro bumps may be deposited on the array of nano-piezoelectric sensors, where the multiple number of flexible micro bumps may be operably coupled to the array of nano-piezoelectric sensors.

Some example articles may include machine-readable instructions for forming a multiple number of nano-piezoelectric sensors. Such machine-readable instructions may include forming a multiple number of nano-piezoelectric sensors. Such instructions may include depositing a multiple number of bottom electrodes on a flexible substrate, where the deposited bottom electrodes may have a substantially parallel pattern. A multiple number of nano-piezoelectric wires may be deposited on the flexible substrate, where the deposited multiple number of nano-piezoelectric wires may have a substantially checkerboard pattern. A multiple number of top electrodes may be deposited such that the multiple number of top electrodes are electrically coupled to the multiple number of nano-piezoelectric wires to form an array of nano-piezoelectric sensors, where the deposited multiple number of top electrodes may have a substantially parallel pattern. A multiple number of flexible micro bumps may be deposited on the array of nano-piezoelectric sensors, where the multiple number of flexible micro bumps may be operably coupled to the array of nano-piezoelectric sensors.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings:

FIG. 18 is an illustration of an example computer program product; and

DETAILED DESCRIPTION

Figure 1:
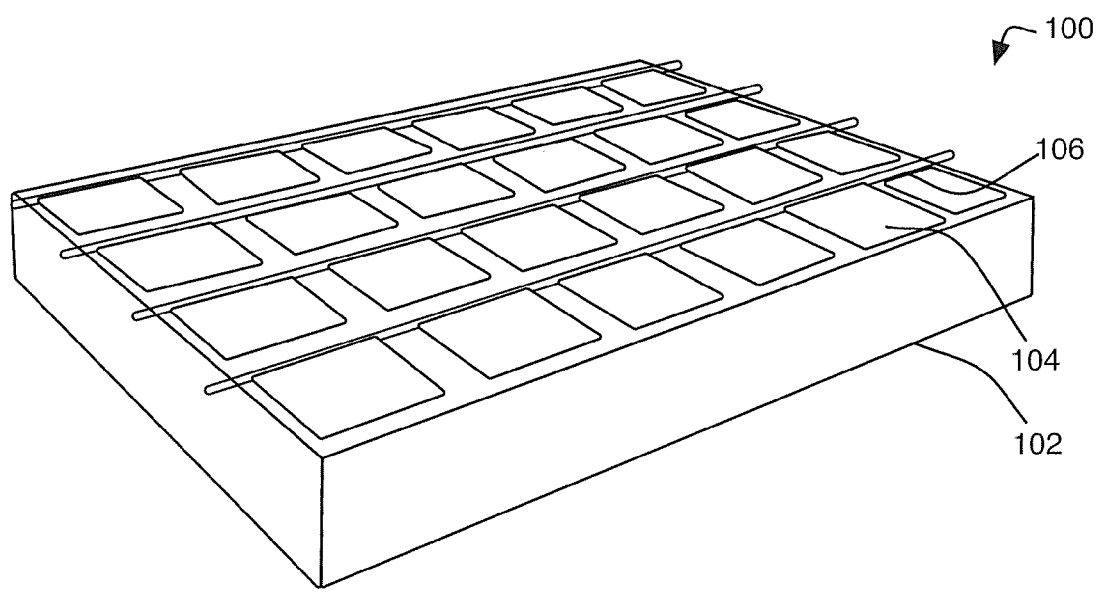
FIG. 1 is an illustration of a perspective view of an example tactile device at a given stage of processing.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is generally drawn, inter alia, to methods, apparatus, and systems related to manufacturing tactile devices including flexible micro bumps operably coupled to an array of nano-piezoelectric sensors.

Some types of tactile information may be obtained by an electronic skin-type tactile device (e-skin). As will be described in greater detail below, a tactile device is described herein that may include flexible micro bumps operably coupled to an array of nano-piezoelectric sensors. Such a tactile device may be configured to sense a pressure distribution and surface morphology through a static-type contact and/or sense a surface texture through a dynamic-type contact. As will be described in greater detail below, the sensing of pressure distribution and surface morphology and/or surface texture may be based at least in part on frequency, amplitude, and polarity data from the array of nano-piezoelectric sensors.

For example, such sensed pressure distribution data and surface texture (e.g., relative sliding) may be utilized to judge material type, material strength, etc. Human skin obtains this information by the actions of "touch" and "stroke". With the tactile device, "touch" may be obtained by the pressure distribution and surface morphology of static contact, and "stroke" may be obtained by judging surface texture of the object in the course of relative sliding.

FIG. 1 is an illustration of a perspective view of an example tactile device at a given stage of processing, arranged in accordance with at least some embodiments of the present disclosure. In the illustrated example, an example tactile device 100 may include a flexible substrate 102. In some examples, flexible substrate 102 may include one or more of the following materials: polyimide, polyester, polyethylene terephthalate, polyethylene naphthalate, aramid, poly(dimethylsiloxane), epoxy, liquid crystal polymer, the like, and/or combinations thereof.

In some examples, tactile device 100 may include a layer of catalyst 104. Layer of catalyst 104 may be deposited on flexible substrate 102 prior to depositing nano-piezoelectric wires. In some examples, the deposited layer of catalyst 104 may have a substantially checkerboard pattern, as illustrated in FIG. 1. In some examples, deposition of layer of catalyst 104 may be done via stamping, patterning by e-beam, sputtering, patterning by photolithography, chemical vapor deposition (CVD), printing (e.g., inkjet printing or the like), electrospinning, shadow masks, the like, and/or combinations thereof. In some examples, layer of catalyst 104 may include one or more of the following materials: gold, zinc oxide, gallium nitride, a layer of seed layer, the like, and/or combinations thereof.

In some examples, tactile device 100 may include a multiple number of bottom electrodes 106. Bottom electrodes 106 may be deposited on flexible substrate 100. For example, bottom electrodes 106 may be deposited in a substantially parallel pattern, as illustrated. In some examples, deposition of bottom electrodes 106 may be done via patterning by photolithography, printing (e.g., inkjet printing, imprinting or the like), electroplating, sputtering, evaporation, the like, and/or combinations thereof. In some examples, bottom electrodes 106 may include one or more of the following materials: nickel/gold (Ni/Au), titanium/gold (Ti/Au), the like, and/or combinations thereof.

Figure 2:
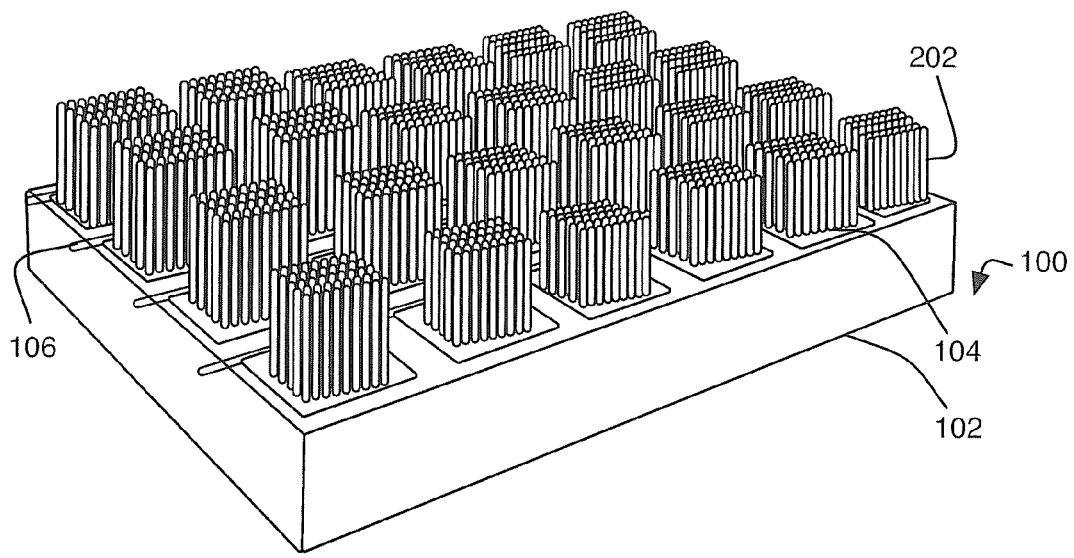
FIG. 2 is an illustration of a perspective view of the example tactile device of FIG. 1 at a given stage of processing.

FIG. 2 is an illustration of a perspective view of the example tactile device of FIG. 1 at a given stage of processing, arranged in accordance with at least some embodiments of the present disclosure. In the illustrated example, tactile device 100 may include a multiple number of nano-piezoelectric wires 202. In some examples, nano-piezoelectric wires 202 may be deposited directly onto flexible substrate 102. In other examples, nano-piezoelectric wires 202 may be deposited onto layer of catalyst 104. In some examples, nano-piezoelectric wires 202 may have a perpendicular orientation with respect to flexible substrate 102, as illustrated in FIG. 2.

In some examples, deposition of nano-piezoelectric wires 202 may be done via direct growth (e.g., grown on layer of catalyst 104 or flexible substrate 102), or via physical transfer of externally grown nano-piezoelectric wires. In some examples, nano-piezoelectric wires 202 may include one or more of the following materials zinc oxide-type nano-wire, gallium nitride-type nano-wire, lead zirconatetitanate-type nano-wire, the like, and/or combinations thereof. For example, nano-piezoelectric wires 202 may have a wire-type shape, a sheet-type shape, or other type shape so long as nano-piezoelectric wires 202 operate as a piezoelectric material with oriented crystal directions. For example, the nano-piezoelectric wires 202 may be formed initially with a wire-type shape, such as nano-wire (e.g. zinc oxide-type nano-wire, gallium nitride-type nano-wire, lead zirconatetitanate-type nano-wire) or formed initially as nano-sheets (zinc oxide-type nano-sheet, gallium nitride-type nano-sheet and lead zirconatetitanate-type nano-sheet), which may be optionally left as nano-sheets or may be later patterned into a wire-type shape.

In one non-limiting example, vertically aligned ZnO-type nano-piezoelectric wires 202 may be directly grown on layer of catalyst 104. See for example, growth techniques discussed in Sheng Xu, Nagesh Adiga, Shan Ba, Tirthankar Dasgupta, C. F. Jeff Wu, and Zhong Lin Wang, "Optimizing and improving the growth quality of ZnO nano-wire arrays guided by statistical design of experiments". ACS Nano 3, (2009): 1803-1812. The same or similar methods may be utilized for forming nano-piezoelectric wires 202 of various materials.

Nano-piezoelectric wires 202 may, in some aspects, function as a nanogenerator. As a nanogenerator, nano-piezoelectric wires 202 may collect mechanical energy (e.g., such as shock, friction, microfluid and/or acoustic wave) from the microenvironment, which may converted to the electronic energy. In addition to operating as a nanogenerator, nano-piezoelectric wires 202 may function with semiconducting properties. Such semiconducting properties may use piezoelectric potential to adjust the electron transport in nano-piezoelectric wires 202, which may adjust an associated channel current.

One application of nano-piezoelectric wires 202 may be strain sensing. As used herein the term "strain" may refer to any variety of strain including but not limited to tensile strain, compressive strain, bending strain, axial strain, shear strain, or torsional strain, the like, and/or combinations thereof.

Figure 3:
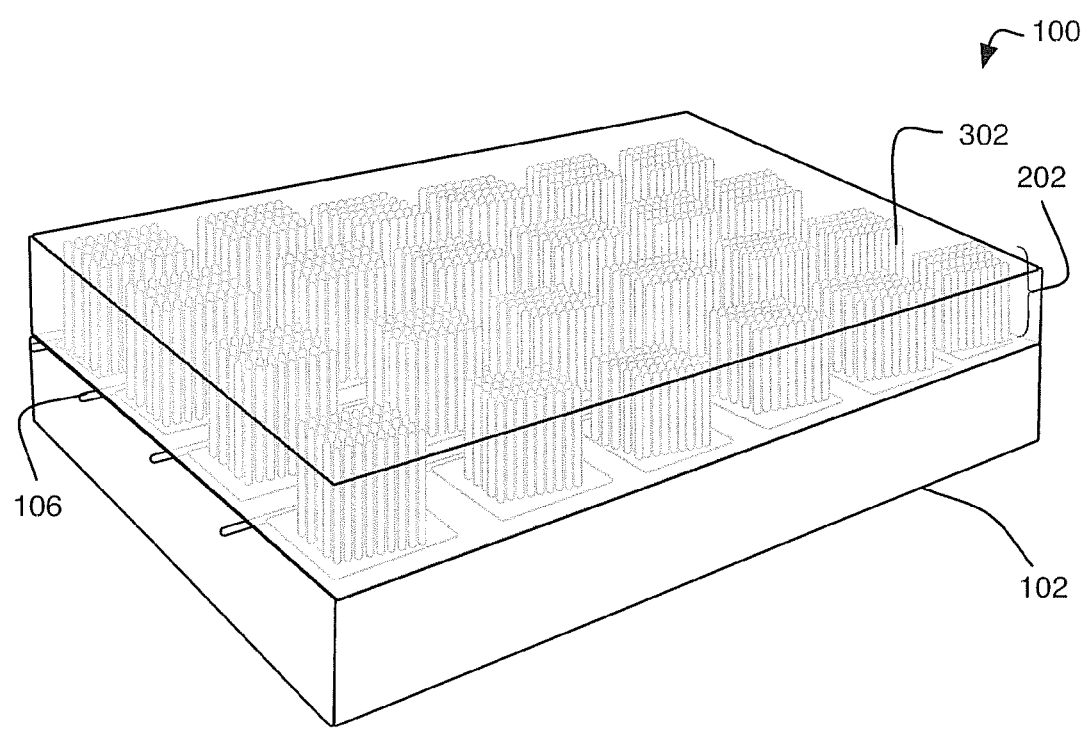
FIG. 3 is an illustration of a perspective view of the example tactile device of FIG. 1 at a given stage of processing.

FIG. 3 is an illustration of a perspective view of the example tactile device of FIG. 1 at a given stage of processing, arranged in accordance with at least some embodiments of the present disclosure. In the illustrated example, tactile device 100 may include a layer of flexible insulation material 302. In some examples, layer of flexible insulation material 302 may be located between nano-piezoelectric wires 202.

For example, layer of flexible insulation material 302 may be deposited between multiple number of nano-piezoelectric wires 202 prior to depositing top electrodes. In such an example, a portion (not shown) of flexible insulation material 302 may be removed (e.g., via plasma etching or the like) to expose a top end (not shown) of nano-piezoelectric wires 202 for later connection with top electrodes.

In some examples, deposition of flexible insulation material 302 may be done via stamping, spin-coating, inkjet printing, imprinting, the like, and/or combinations thereof. In some examples, flexible insulation material 302 may include one or more of the following materials: polydimethylsiloxane (PDMS), silicone rubber, other insulating polymer materials, the like, and/or combinations thereof.

Figure 4:
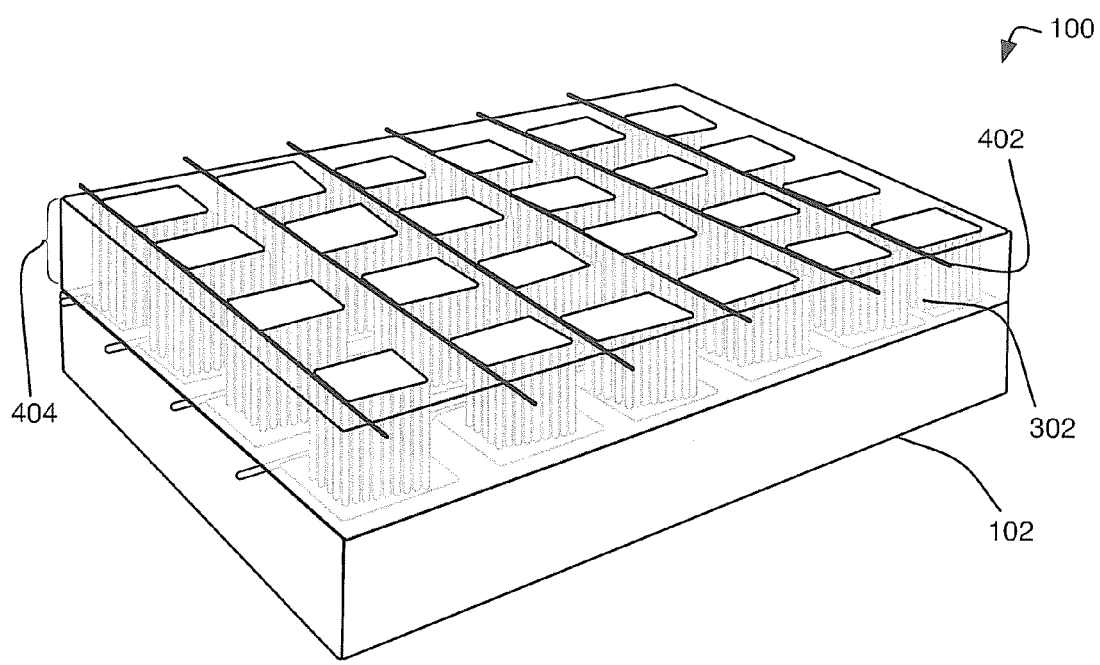
FIG. 4 is an illustration of a perspective view of the example tactile device of FIG. 1 at a given stage of processing.

FIG. 4 is an illustration of a perspective view of the example tactile device of FIG. 1 at a given stage of processing, arranged in accordance with at least some embodiments of the present disclosure. In the illustrated example, tactile device 100 may include a multiple number of top electrodes 402. Top electrodes 402 may be deposited such that top electrodes 402 may be electrically coupled to nano-piezoelectric wires 202 (see, e.g., FIG. 2). In some examples, top electrodes 402 may have a substantially parallel pattern, as illustrated in FIG. 4.

In some examples, deposition of top electrodes 402 may be done via patterning by photolithography, printing (e.g., inkjet printing, imprinting or the like), electroplating, sputtering, evaporation, the like, and/or combinations thereof. In some examples, top electrodes 402 may include one or more of the following materials: nickel/gold (Ni/Au), titanium/gold (Ti/Au), the like, and/or combinations thereof.

In some examples, top electrodes 402, nano-piezoelectric wires 202 (see, e.g., FIG. 2), and/or bottom electrodes 106 may form an array of nano-piezoelectric sensors 404. Such array of nano-piezoelectric sensors 404 may be coupled to flexible substrate 102, where array of nano-piezoelectric sensors 404 may include layer of nano-piezoelectric wires 202 (see, e.g., FIG. 2).

Figure 5:
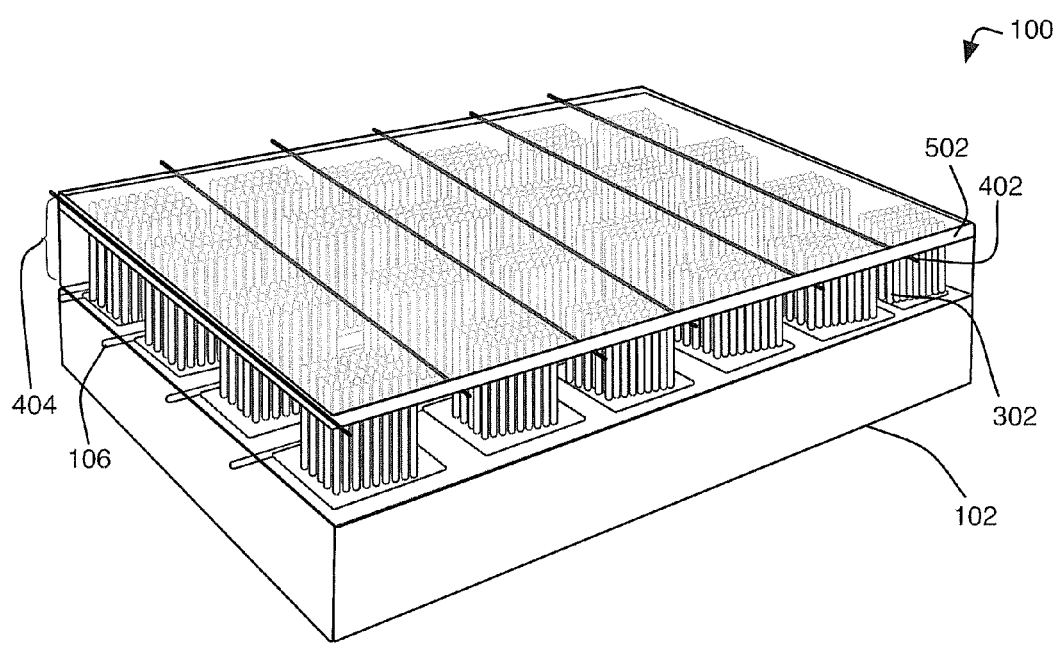
FIG. 5 is an illustration of a perspective view of the example tactile device of FIG. 1 at a given stage of processing.

FIG. 5 is an illustration of a perspective view of the example tactile device of FIG. 1 at a given stage of processing, arranged in accordance with at least some embodiments of the present disclosure. In the illustrated example, tactile device 100 may include a top layer of flexible insulation material 502. In some examples, top layer of flexible insulation material 502 may be deposited on top electrodes 402. For example, top layer of flexible insulation material 502 may be deposited on top electrodes 402 prior to depositing flexible micro bumps.

In some examples, deposition of top layer of flexible insulation material 502 may be done via stamping, spin-coating, inkjet printing, imprinting, the like, and/or combinations thereof. In some examples, top layer of flexible insulation material 502 may include one or more of the following materials: polydimethylsiloxane (PDMS), silicone rubber, other insulating polymer materials, the like, and/or combinations thereof.

In operation, top layer of flexible insulation material 502 may insulate top electrodes 402 from a static-charge screen material. Additional details regarding such a static-charge screen material may be found below with regard to FIG. 6.

Figure 6:
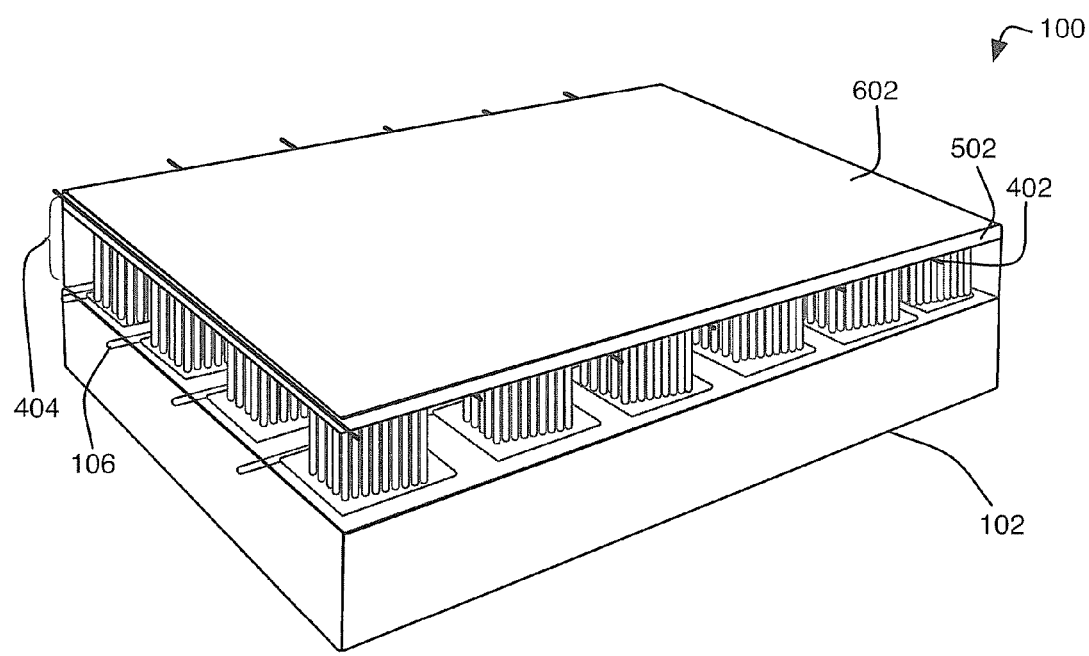
FIG. 6 is an illustration of a perspective view of the example tactile device of FIG. 1 at a given stage of processing.

FIG. 6 is an illustration of a perspective view of the example tactile device of FIG. 1 at a given stage of processing, arranged in accordance with at least some embodiments of the present disclosure. In the illustrated example, tactile device 100 may include a static-charge screen material 602. Static-charge screen material 602 may be deposited on top layer of flexible insulation 502. In some examples, top layer of flexible insulation material 502 and/or static-charge screen material 602 may be located between a multiple number of flexible micro bumps (see, e.g., FIG. 7) and array of nano-piezoelectric sensors 404.

In some examples, deposition of static-charge screen material 602 may be done via transferring, stamping, patterning by e-beam, sputtering, patterning by photolithography, chemical vapor deposition (CVD), printing (e.g., inkjet printing, imprinting or the like), electrospinning, shadow masks, the like, and/or combinations thereof. In some examples, static-charge screen material 602 may include one or more of the following materials: graphene, carbon nanotubes networks, conductive rubber, the like, and/or combinations thereof.

In operation, static-charge screen material 602 (and/or top layer of flexible insulation material 502) may reduce the impact of static electricity on tactile device 100. For example, a statistic charge could potentially cause fault for an output signal of tactile device 100.

Figure 7:
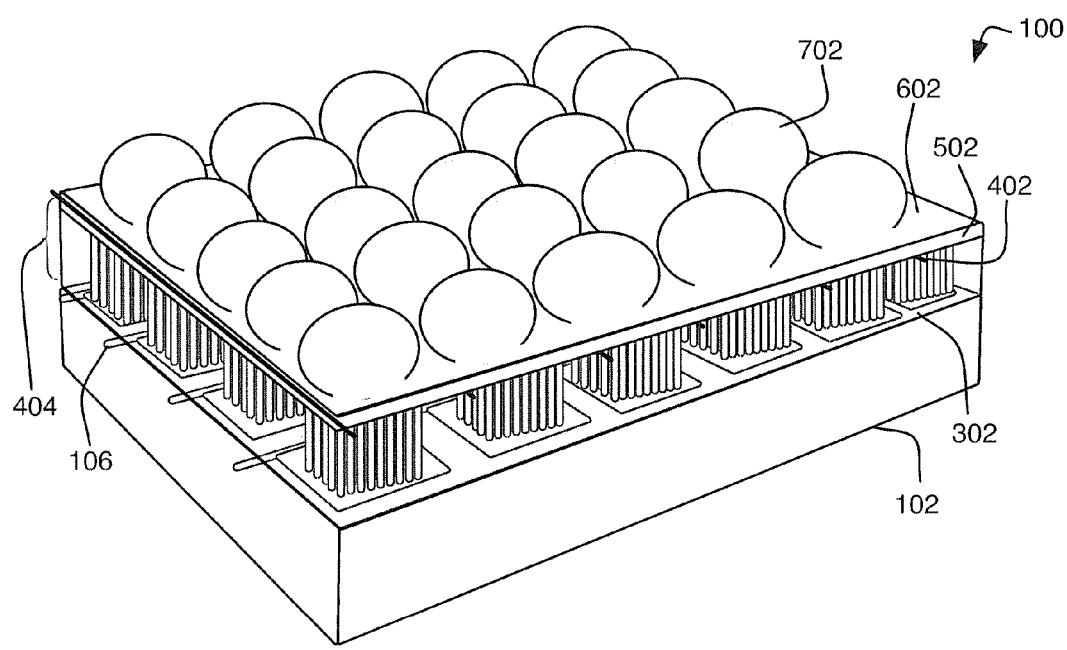
FIG. 7 is an illustration of a perspective view of the example tactile device of FIG. 1 at a given stage of processing.

FIG. 7 is an illustration of a perspective view of the example tactile device of FIG. 1 at a given stage of processing, arranged in accordance with at least some embodiments of the present disclosure. In the illustrated example, tactile device 100 may include a multiple number of flexible micro bumps 702. Flexible micro bumps 702 may be deposited on array of nano-piezoelectric sensors 404. Flexible micro bumps 702 may be operably coupled to array of nano-piezoelectric sensors 404. In some examples, flexible micro bumps 702 may be directly deposited on array of nano-piezoelectric sensors 404. In other examples, flexible micro bumps 702 may be deposited on array of nano-piezoelectric sensors 404 with one or more intervening layers (such as static-charge screen material 602 and/or top layer of flexible insulation material 502, for example).

In some examples, flexible micro bumps 702 may form an uneven surface. For example, individual flexible micro bumps 702 may include a semi-circular-type shape, a semi elliptical-type shape, the like, and/or combinations thereof.

In some examples, deposition of flexible micro bumps 702 may be done via stamping, printing (e.g., inkjet printing or the like), spin-coating and etching, the like, and/or combinations thereof. In other examples, flexible micro bumps 702 may deposited as a film that may then be etched into flexible micro bumps 702, such as by plasma etching or the like. In some examples, flexible micro bumps 702 may include one or more of the following materials: polydimethylsiloxane (PDMS), silicone rubber, the like, and/or combinations thereof.

In operation, flexible micro bumps 702 operably coupled to array of nano-piezoelectric sensors 404 may be configured to sense a pressure distribution and surface morphology through a static-type contact and/or sense a surface texture through a dynamic-type contact. As will be described in greater detail below, the sensing of pressure distribution and surface morphology and/or surface texture may be based at least in part on frequency, amplitude, and polarity data from array of nano-piezoelectric sensors 404.

Figure 8:
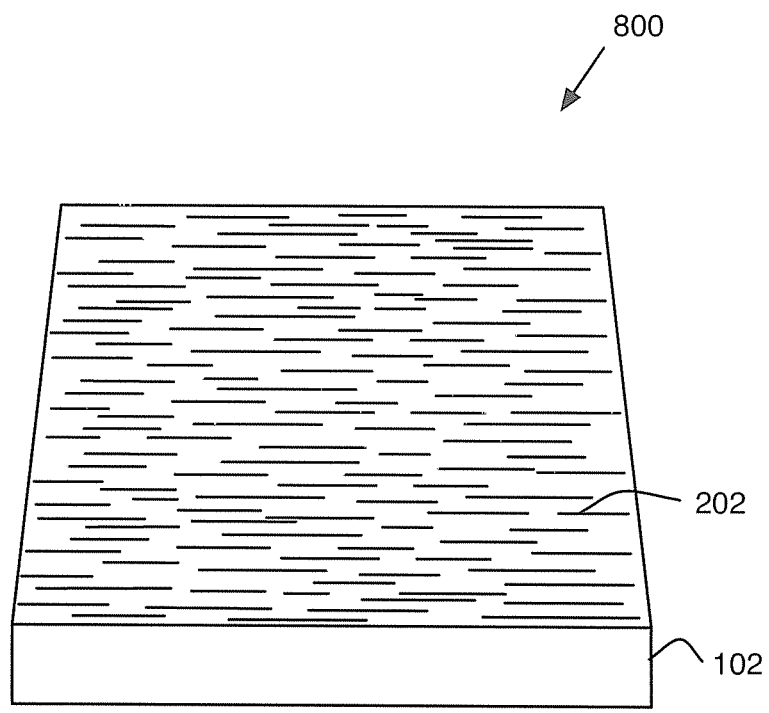
FIG. 8 is an illustration of a perspective view of another example tactile device at a given stage of processing.

FIG. 8 is an illustration of a perspective view of another example tactile device at a given stage of processing, arranged in accordance with at least some embodiments of the present disclosure. In the illustrated example, another example tactile device 800 may include nano-piezoelectric wires 202. In such an example, nano-piezoelectric wires 202 may be deposited on flexible substrate 102 in a horizontal alignment with respect to flexible substrate 102 and with a substantially parallel pattern with respect to individual nano-piezoelectric wires 202, as illustrated in FIG. 8.

In one non-limiting example, horizontally aligned ZnO-type nano-piezoelectric wires 202 may be grown directly on flexible substrate 102. See for example, growth techniques discussed in Yong Qin, Rusen Yang and Zhong Lin Wang, "Growth of Horizontal ZnO Nano-wire Arrays on Any Substrate", J. Phys. Chem, C 112, (2008): 18734-18736. The same or similar methods may be utilized for forming nano-piezoelectric wires 202 of various materials.

Additionally or alternatively, nano-piezoelectric wires 202 may be grown separately (e.g., such as described above with respect to FIG. 2) from flexible substrate 102 and transplanted using transfer technology to make nano-piezoelectric wires 202 have the substantially parallel pattern illustrated in FIG. 8. For example, such transfer technology may include transfer printing and/or the like. See for example, transfer printing techniques discussed in Guang Zhu, Rusen Yang, Sihong Wang, and Zhong Lin Wang, "Flexible High-Output Nanogenerator Based on Lateral ZnO Nano-wire Array", Nano Letters 10, (2010): 3151-3155; Fan, Z. et al. "Towards the development of printable nano-wire electronics and sensors". Adv. Mater. 21, (2009): 3730-3743; and/or Zhiyong Fan, Johnny C. Ho, Zachery A. Jacobson, Roie Yerushalmi, Robert L. Alley, Haleh Razavi, and Ali Javey, "Wafer-scale assembly of highly ordered semiconductor nano-wire arrays by contact printing". Nano Lett. 8, (2008): 20-25.

Figure 9:
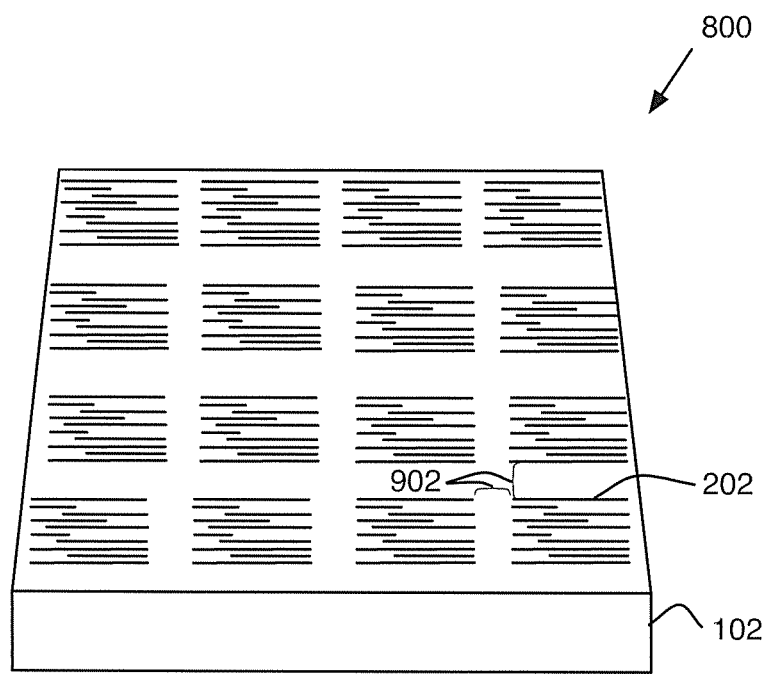
FIG. 9 is an illustration of a perspective view of the example tactile device of FIG. 8 at a given stage of processing.

FIG. 9 is an illustration of a perspective view of the example tactile device of FIG. 8 at a given stage of processing, arranged in accordance with at least some embodiments of the present disclosure. In the illustrated example, a multiple number of portions 902 of nano-piezoelectric wires 202 may be removed. For example, portions 902 of nano-piezoelectric wires 202 may be removed to form substantially checkerboard pattern, as is illustrated in FIG. 9. In some examples, removal of portions 902 of nano-piezoelectric wires 202 may be done via etching, the like, and/or combinations thereof.

Figure 10:
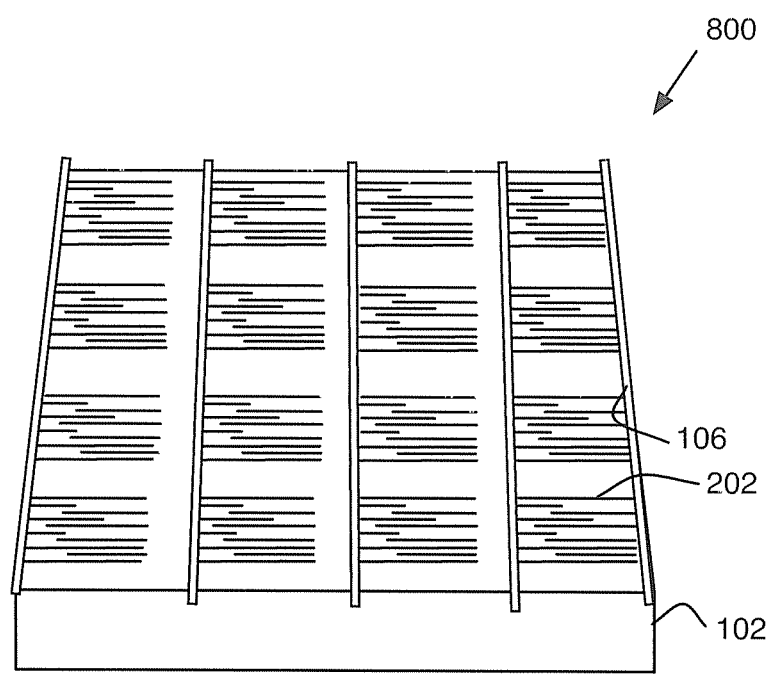
FIG. 10 is an illustration of a perspective view of the example tactile device of FIG. 8 at a given stage of processing.

FIG. 10 is an illustration of a perspective view of the example tactile device of FIG. 8 at a given stage of processing, arranged in accordance with at least some embodiments of the present disclosure. In the illustrated example, bottom electrodes 106 may be deposited on flexible substrate 102 in electrical contact with nano-piezoelectric wires 202. Bottom electrodes 106 may have a substantially parallel pattern, as illustrated in FIG. 10.

Figure 11:
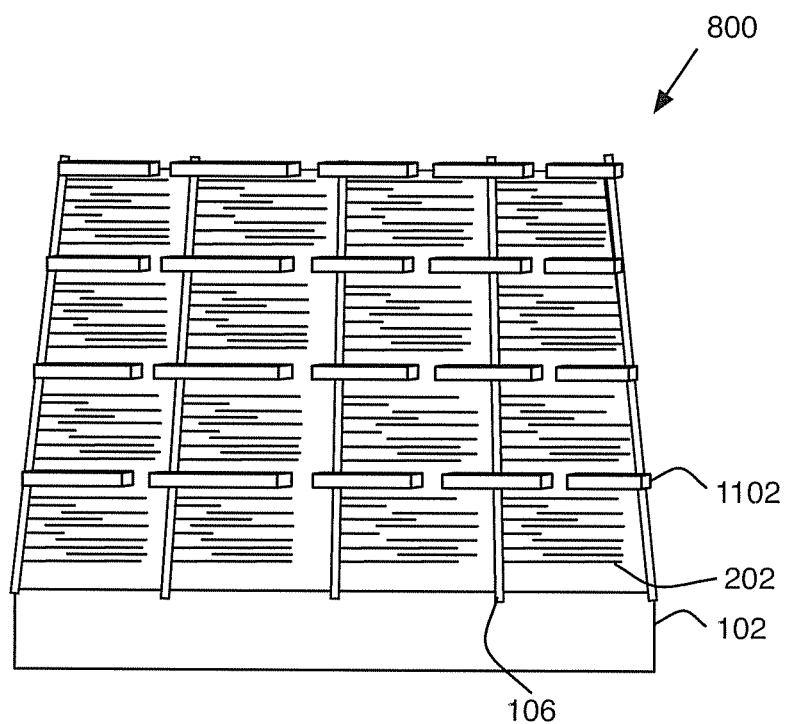
FIG. 11 is an illustration of a perspective view of the example tactile device of FIG. 8 at a given stage of processing.

FIG. 11 is an illustration of a perspective view of the example tactile device of FIG. 8 at a given stage of processing, arranged in accordance with at least some embodiments of the present disclosure. In the illustrated example, tactile device may include a layer of insulation material 1102. For example, layer of insulation material 1102 may be deposited on bottom electrodes 106 prior to depositing top electrodes 404 (not shown).

In some examples, deposition of layer of insulation material 1102 may be done via stamping, patterning by e-beam, sputtering, patterning by photolithography, chemical vapor deposition (CVD), printing (e.g., inkjet printing, imprinting or the like), electrospinning, shadow masks, the like, and/or combinations thereof. In some examples, layer of insulation material 1102 may include one or more rigid dielectric materials (e.g., aluminum oxide ($Al_2O_3$), silicon dioxide ($SiO_2$), or the like) and/or may include one or more flexible insulating materials (e.g., polydimethylsiloxane (PDMS), silicone rubber, or the like). In examples where layer of insulation material 1102 includes rigid dielectric material, layer of insulation material 1102 may be fabricated only on an overlap position of bottom electrodes 106 and top electrodes (not shown), so as to allow tactile device to still be somewhat flexible.

Figure 12:
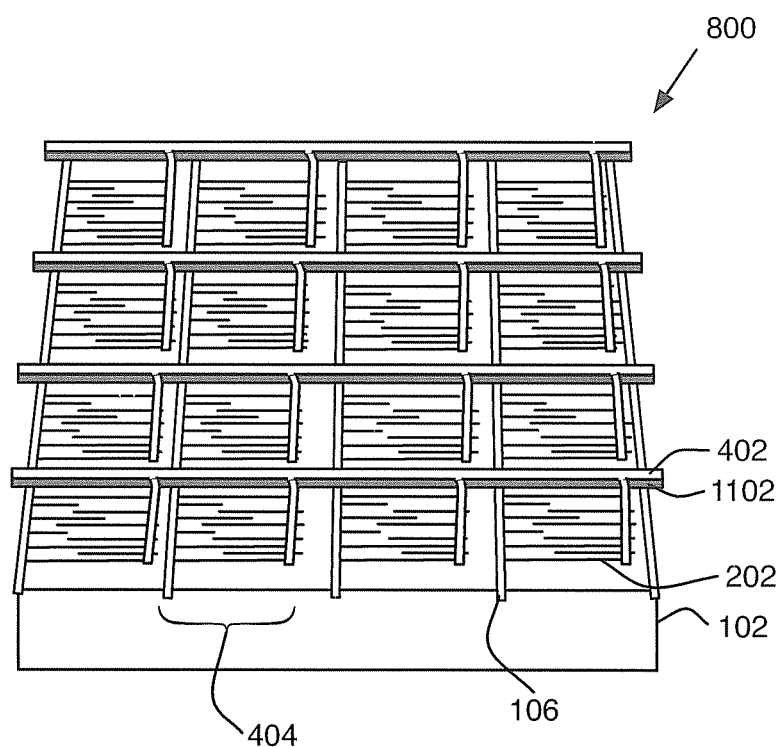
FIG. 12 is an illustration of a perspective view of the example tactile device of FIG. 8 at a given stage of processing.

FIG. 12 is an illustration of a perspective view of the example tactile device of FIG. 8 at a given stage of processing, arranged in accordance with at least some embodiments of the present disclosure. In the illustrated example, top electrodes 402 may be deposited such that top electrodes 402 may be electrically coupled to nano-piezoelectric wires 202 to form array of nano-piezoelectric sensors 404. In some examples, the deposited multiple number of top electrodes may have a substantially parallel pattern, as illustrated in FIG. 12.

Figure 13:
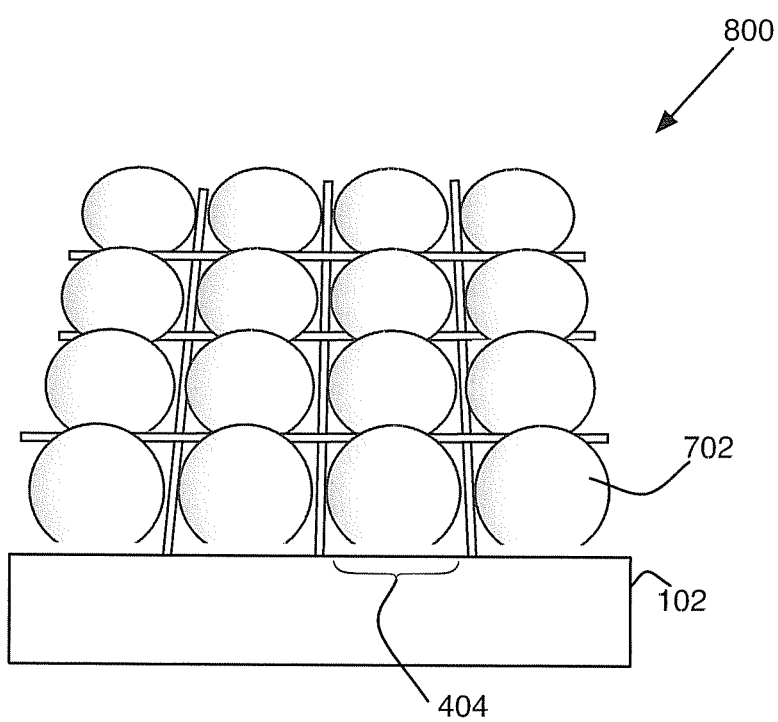
FIG. 13 is an illustration of a perspective view of the example tactile device of FIG. 8 at a given stage of processing.

FIG. 13 is an illustration of a perspective view of the example tactile device of FIG. 8 at a given stage of processing, arranged in accordance with at least some embodiments of the present disclosure. In the illustrated example, flexible micro bumps 702 may be deposited on array of nano-piezoelectric sensors 404. For example, flexible micro bumps 702 may be operably coupled to array of nano-piezoelectric sensors 404.

Figure 14:
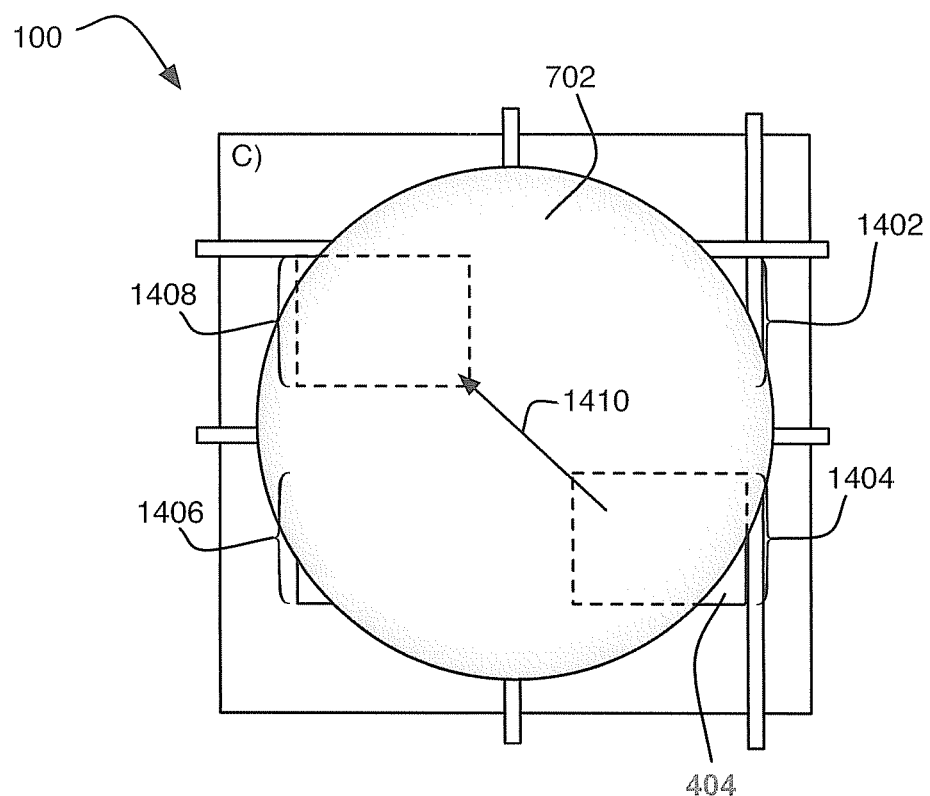
FIG. 14 is an illustration of a top view of an example tactile device in operation.

FIG. 14 is an illustration of a top view of an example tactile device in operation, arranged in accordance with at least some embodiments of the present disclosure. In the illustrated example, tactile device 100 (and/or tactile device 800) may include flexible micro bumps 702 operably coupled to an array of nano-piezoelectric sensors 404. In some examples, flexible micro bumps 702 may be distributed among array of nano-piezoelectric sensors 404 to transfer the strain to one or more of the sensors in array of nano-piezoelectric sensors 404. In the illustrated example, a single flexible micro bump 702 may be operably coupled to four nano-piezoelectric sensors 1402, 1404, 1406, and 1408. In other examples, single flexible micro bump 702 may be operably coupled to a single nano-piezoelectric sensor (e.g., in a one-to-one ratio, as illustrated in FIGS. 7 and 13), operably coupled to nine nano-piezoelectric sensors, the like, and/or combinations thereof. For example, there may be a mixture of ratios between flexible micro bumps 702 and the array of nano-piezoelectric sensors 404 (e.g., some in a one-to-one ratio, some in a one-to-four ratio, some in a one-to-nine ratio, or the like). Such a distribution of flexible micro bumps 702 may decrease the interferences between adjacent sensors in array of nano-piezoelectric sensors 404, and/or to decrease the shielding effects from a surface material to fine surface structures of a target object. Accordingly, tactile device 100 (and/or 800) may sense the fine surface texture of the target object.

In some examples, the sensing of pressure distribution and surface morphology and/or surface texture may be based at least in part on frequency, amplitude, and polarity data from array of nano-piezoelectric sensors 404. For example, such sensed pressure distribution data and surface texture (e.g., relative sliding) may be utilized to judge material type, material strength, etc. Human skin obtains this information by the actions of "touch" and "stroke". With tactile device 100 (and/or 800), "touch" may be obtained by the pressure distribution and surface morphology of static contact, and "stroke" may be obtained by judging surface texture of the object in the course of relative sliding. In some examples, flexible micro bumps 702 may perform similar functions as those preformed with human fingerprint. For example, a strain 1410 (e.g., tensile strain, compressive strain, bending strain, axial strain, shear strain, or torsional strain, the like, and/or combinations thereof) applied to flexible micro bump 702 may be transferred to array of nano-piezoelectric sensors 404.

In the illustrated example, strain 1410 may result in compressive strain being applied to nano-piezoelectric sensor 1408 and tensile strain being applied to nano-piezoelectric sensor 1404. Therefore, the size and the direction of strain 1410 may be judged by comparing the opposite piezoelectric signals, which are output by nano-piezoelectric sensor 1404 and nano-piezoelectric sensor 1408. Accordingly, flexible micro bump 702 may be compressed (e.g., resulting in sensing of distribution and surface morphology) by a target object and/or flexible micro bump 702 may be slid relative to a target object (e.g., resulting in sensing of surface texture), so that the pressure or deformation suffered may be perceived by the internal array of nano-piezoelectric sensors 404. For example, flexible micro bumps 702 may convert a shear force portion of strain 1410 to a vertical pressure which may be easily sensed, so as to produce an unsmooth or smooth tactile sensation. The amplitude and frequency of the compression and/or sliding may closely relate with the surface texture of the target object. The information of surface texture and relative sliding of the target object can be obtained by analyzing the output signal from array of nano-piezoelectric sensors 404, so as to achieve the functions of "touch" and "stroke", as described above. If the surface texture of the target object is different, the frequency and amplitude in response to sliding or compression of flexible micro bumps 702 may be different. For example, texture information of "touched" areas of the target object may be obtained by collecting the nano-piezoelectric signals from array of nano-piezoelectric sensors 404 and analyzing the corresponding data.

In operation, tactile device 100 (and/or tactile device 800) may be configured to sense a pressure distribution and surface morphology through a static-type contact and/or sense a surface texture through a dynamic-type contact. In some examples, tactile device 100 (and/or tactile device 800) may work in a static mode and/or in a dynamic mode at the same time. For example, tactile device 100 may work in the dynamic mode by outputting piezoelectric signal when the stress changes. Under the dynamic situation, the nano-piezoelectric material may deform under stress, and thus piezoelectric potential is induced on the both ends of electrodes 106 and 402 (see, e.g., FIG. 7), which may make the external circuit to induce a transient current pulse. In response to the differences in the size and the direction of strain 1410, a transient current pulse amplitude and a current direction induced in array of nano-piezoelectric sensors 404 may be different. Therefore, the sensed strain information of the nano-piezoelectric material in array of nano-piezoelectric sensors 404 may be measured by the amplitude and the direction of the piezoelectric transient current pulse.

Under the static situation, since tactile device 100 uses semiconducting-type nano-piezoelectric material, the Schottky barrier between the nano-piezoelectric material in array of nano-piezoelectric sensors 404 and electrodes 106 and 402 (see, e.g., FIG. 7) may be adjusted under the piezoelectric potential, and thus may result in a change in rectifying properties. So, for example, if the pressure maintains, the change in the rectifying properties can maintain, and thus tactile device 100 can sense the static pressure (e.g., in addition to dynamic pressure).

Figure 15:
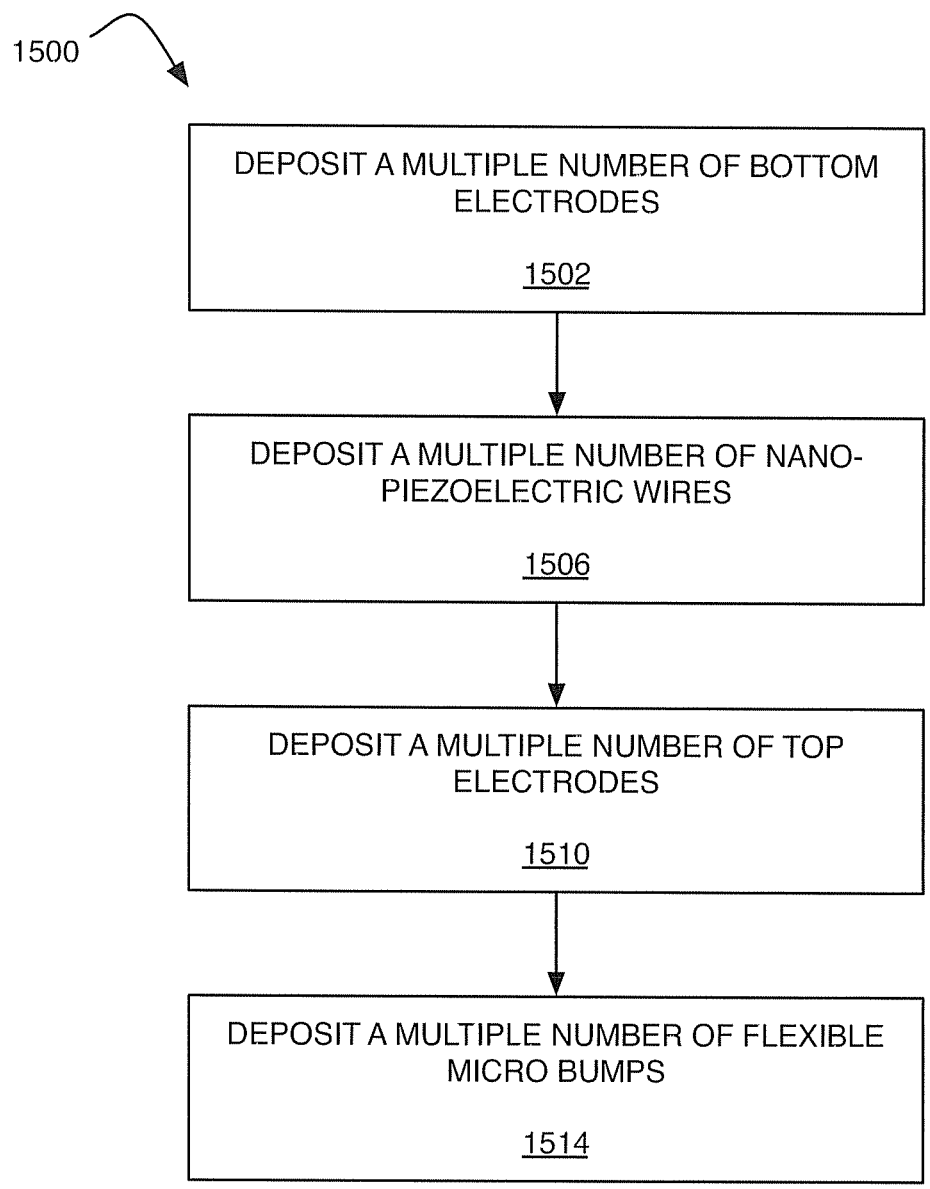
FIG. 15 is an illustration an example process for forming an example tactile device.

FIG. 15 is an illustration an example process 1500 for forming an example tactile device, arranged in accordance with at least some embodiments of the present disclosure. In the illustrated example, process 1500, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 15 may be practiced in various implementations. For example, although process 1500, as shown in FIG. 15, comprises one particular order of blocks or actions, the order in which these blocks or actions are presented does not necessarily limit claimed subject matter to any particular order. Likewise, intervening actions not shown in FIG. 15 and/or additional actions not shown in FIG. 15 may be employed and/or some of the actions shown in FIG. 15 may be eliminated, without departing from the scope of claimed subject matter. Process 1500 may include one or more of operations as illustrated by blocks 1502, 1506, 1510, and/or 1514.

As illustrated, process 1500 may be implemented to manufacture tactile devices including flexible micro bumps operably coupled to an array of nano-piezoelectric sensors. Processing may begin at operation 1502, "DEPOSIT A MULTIPLE NUMBER OF BOTTOM ELECTRODES", where a multiple number of bottom electrodes may be deposited on a flexible substrate. For example, a multiple number of bottom electrodes may be deposited on a flexible substrate, where the deposited multiple number of bottom electrodes may have a substantially parallel pattern.

Processing may continue from operation 1502 to operation 1506, "DEPOSIT A MULTIPLE NUMBER OF NANO-PIEZOELECTRIC WIRES", where a multiple number of nano-piezoelectric wires may be deposited on the flexible substrate. For example, multiple number of nano-piezoelectric wires may be deposited on the flexible substrate where the deposited multiple number of nano-piezoelectric wires may have a substantially checkerboard pattern.

Processing may continue from operation 1506 to operation 1510, "DEPOSIT A MULTIPLE NUMBER OF TOP ELECTRODES", where a multiple number of top electrodes may be deposited such that the multiple number of top electrodes may be electrically coupled to the multiple number of nano-piezoelectric wires. For example, a multiple number of top electrodes may be deposited such that the multiple number of top electrodes may be electrically coupled to the multiple number of nano-piezoelectric wires to form an array of nano-piezoelectric sensors. In some examples, the deposited multiple number of top electrodes may have a substantially parallel pattern.

Processing may continue from operation 1510 to operation 1514, "DEPOSIT A MULTIPLE NUMBER OF FLEXIBLE MICRO BUMPS", where a multiple number of flexible micro bumps may be deposited on the array of nano-piezoelectric sensors. For example, a multiple number of flexible micro bumps may be deposited on the array of nano-piezoelectric sensors where the multiple number of flexible micro bumps may be operably coupled to the array of nano-piezoelectric sensors.

Additional or alternative details regarding process 1500 may be described in greater detail below with regard to FIG. 16 and/or FIG. 17.

Figure 16:
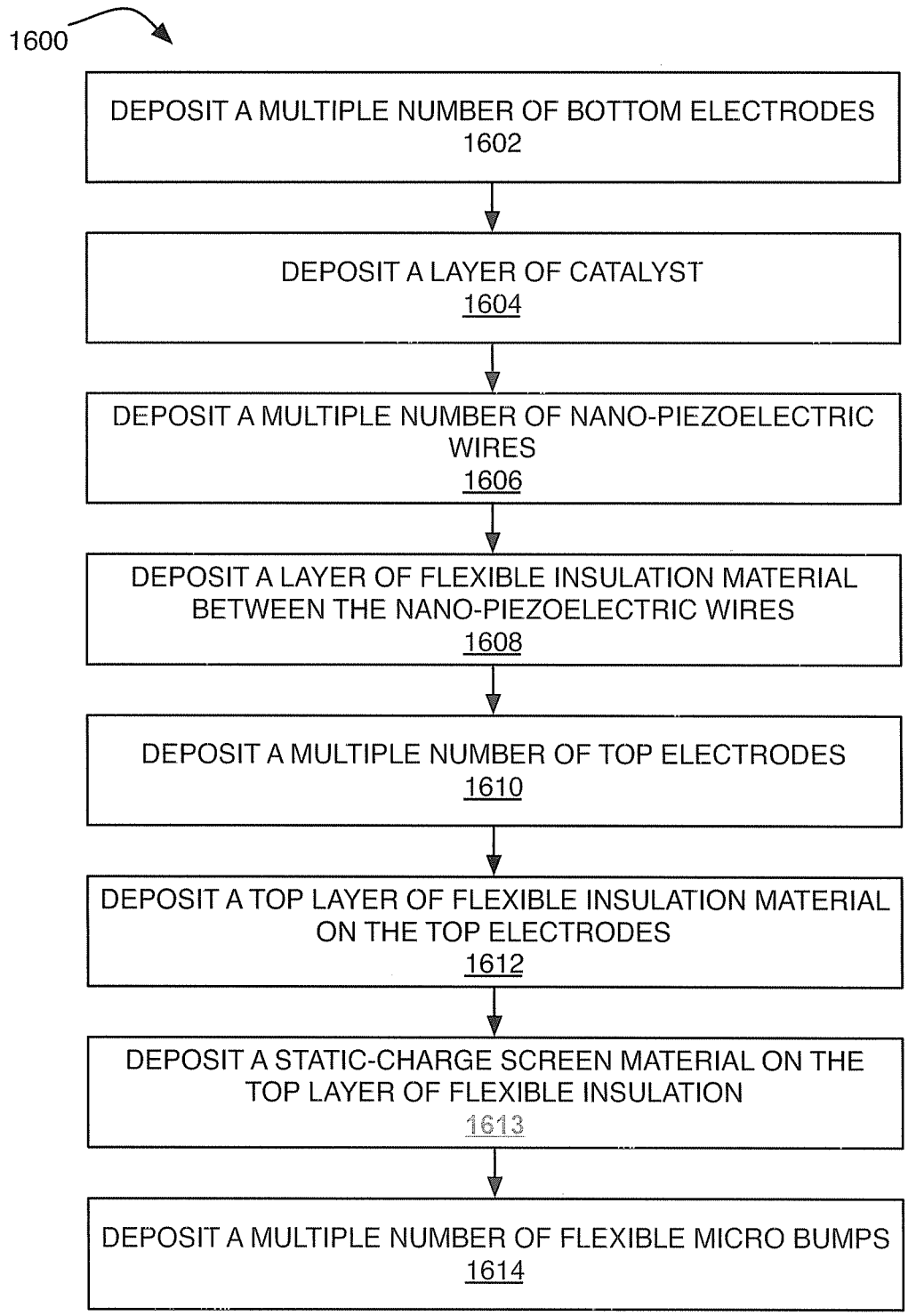
FIG. 16 is an illustration an example process for forming an example tactile device.

FIG. 16 is an illustration an example process 1600 for forming an example tactile device, arranged in accordance with at least some embodiments of the present disclosure. In the illustrated example, process 1600 may include one or more of operations as illustrated by blocks 1602, 1604, 1606, 1608, 1610, 1612, 1613, and/or 1614.

As illustrated, process 1600 may be implemented to manufacture tactile devices including flexible micro bumps operably coupled to an array of nano-piezoelectric sensors. Processing may begin at operation 1602, "DEPOSIT A MULTIPLE NUMBER OF BOTTOM ELECTRODES", where a multiple number of bottom electrodes may be deposited on a flexible substrate. For example, a multiple number of bottom electrodes may be deposited on a flexible substrate, where the deposited multiple number of bottom electrodes may have a substantially parallel pattern.

Processing may continue from operation 1602 to operation 1604, "DEPOSIT A LAYER OF CATALYST", where a layer of catalyst may be deposited on the substrate. For example, a layer of catalyst may be deposited on the substrate prior to depositing nano-piezoelectric wires. In some examples, the deposited layer of catalyst may have a substantially checkerboard pattern.

Processing may continue from operation 1604 to operation 1606, "DEPOSIT A MULTIPLE NUMBER OF NANO-PIEZOELECTRIC WIRES", where a multiple number of nano-piezoelectric wires may be deposited. For example, multiple number of nano-piezoelectric wires may be deposited on the flexible substrate by depositing the multiple number of nano-piezoelectric wires on the layer of catalyst. In some examples, the multiple number of nano-piezoelectric wires may have a perpendicular orientation with respect to the substrate.

Processing may continue from operation 1606 to operation 1608, "DEPOSIT A LAYER OF FLEXIBLE INSULATION MATERIAL BETWEEN THE NANO-PIEZOELECTRIC WIRES", where a layer of flexible insulation material may be deposited between the multiple number of nano-piezoelectric wires. For example, a layer of flexible insulation material may be deposited between the multiple number of nano-piezoelectric wires prior to depositing top electrodes.

Processing may continue from operation 1608 to operation 1610, "DEPOSIT A MULTIPLE NUMBER OF TOP ELECTRODES", where a multiple number of top electrodes may be deposited such that the multiple number of top electrodes may be electrically coupled to the multiple number of nano-piezoelectric wires. For example, a multiple number of top electrodes may be deposited such that the multiple number of top electrodes may be electrically coupled to the multiple number of nano-piezoelectric wires to form an array of nano-piezoelectric sensors. In some examples, the deposited multiple number of top electrodes may have a substantially parallel pattern.

Processing may continue from operation 1610 to operation 1612, "DEPOSIT A TOP LAYER OF FLEXIBLE INSULATION MATERIAL ON THE TOP ELECTRODES", where a top layer of flexible insulation material may be deposited on the multiple number of top electrodes. For example, a top layer of flexible insulation material may be deposited on the multiple number of top electrodes prior to depositing flexible micro bumps.

Processing may continue from operation 1612 to operation 1613, "DEPOSIT A STATIC-CHARGE SCREEN MATERIAL ON THE TOP LAYER OF FLEXIBLE INSULATION", where a static-charge screen material may be deposited on the top layer of flexible insulation. For example, a static-charge screen material may be deposited on the top layer of flexible insulation, where the top layer of flexible insulation material and/or the static-charge screen material are located between a multiple number of flexible micro bumps and the array of nano-piezoelectric sensors.

Processing may continue from operation 1613 to operation 1614, "DEPOSIT A MULTIPLE NUMBER OF FLEXIBLE MICRO BUMPS", where a multiple number of flexible micro bumps may be deposited on the array of nano-piezoelectric sensors. For example, a multiple number of flexible micro bumps may be deposited on the array of nano-piezoelectric sensors where the multiple number of flexible micro bumps may be operably coupled to the array of nano-piezoelectric sensors.

Figure 17:
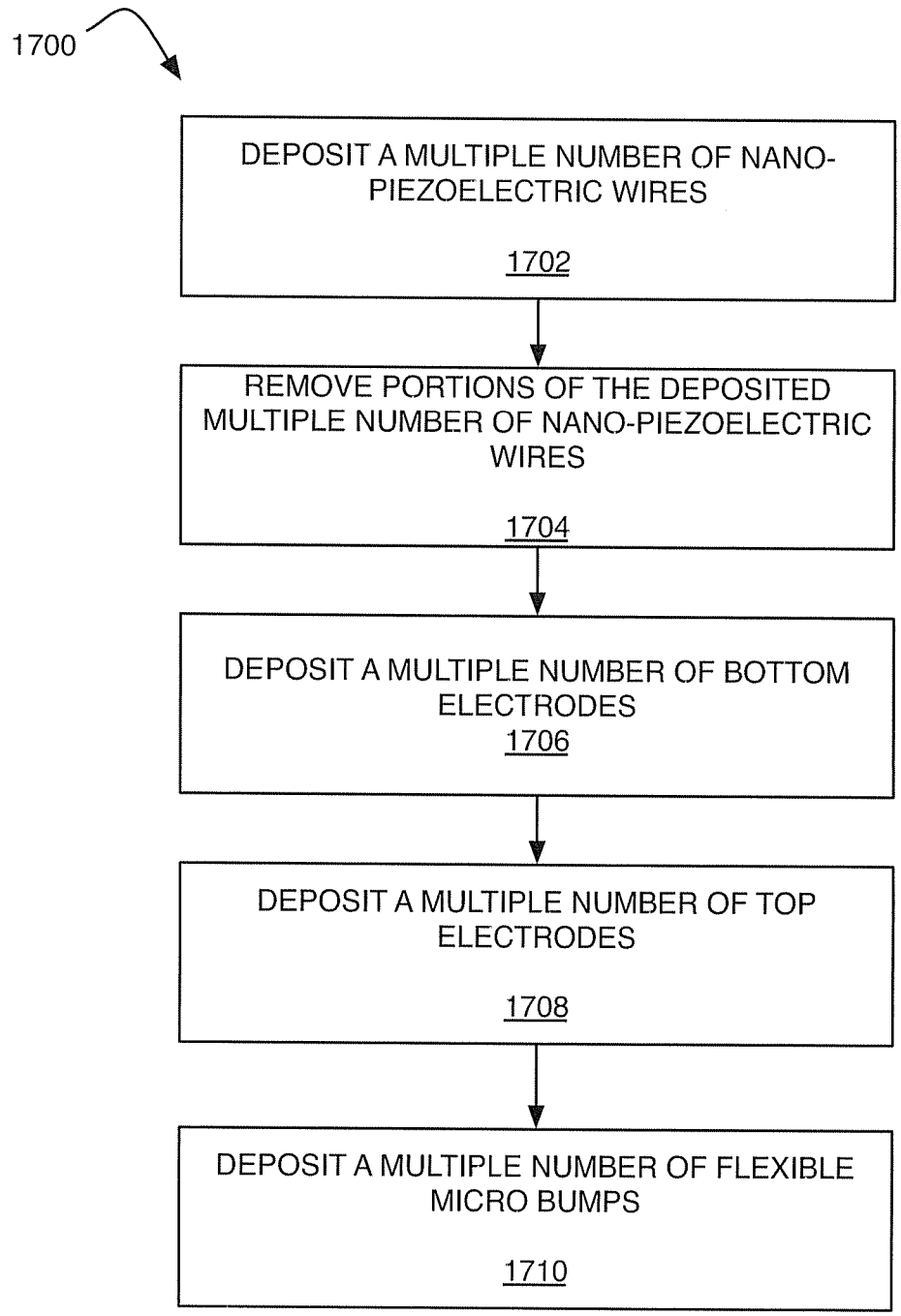
FIG. 17 is an illustration an example process for forming another example tactile device.

FIG. 17 is an illustration an example process 1700 for forming another example tactile device, arranged in accordance with at least some embodiments of the present disclosure. In the illustrated example, process 1700 may include one or more of operations as illustrated by blocks 1702, 1704, 1706, 1708, and/or 1710.

As illustrated, process 1700 may be implemented to manufacture tactile devices including flexible micro bumps operably coupled to an array of nano-piezoelectric sensors. Processing may begin at operation 1702, "DEPOSIT A MULTIPLE NUMBER OF NANO-PIEZOELECTRIC WIRES", where a multiple number of nano-piezoelectric wires may be deposited on a flexible substrate. For example, a multiple number of nano-piezoelectric wires may be deposited on a flexible substrate, where the deposited multiple number of nano-piezoelectric wires have a substantially parallel pattern.

Processing may continue from operation 1702 to operation 1704, "REMOVE PORTIONS OF THE DEPOSITED MULTIPLE NUMBER OF NANO-PIEZOELECTRIC WIRES", where portions of the deposited multiple number of nano-piezoelectric wires may be removed. For example, portions of the deposited multiple number of nano-piezoelectric wires may be removed to form substantially checkerboard pattern.

Processing may continue from operation 1704 to operation 1706, "DEPOSIT A MULTIPLE NUMBER OF BOTTOM ELECTRODES", where a multiple number of bottom electrodes may be deposited on the flexible substrate. For example, a multiple number of bottom electrodes may be deposited on the flexible substrate in electrical contact with the nano-piezoelectric wires, where the deposited multiple number of bottom electrodes may have a substantially parallel pattern.

Processing may continue from operation 1706 to operation 1708, "DEPOSIT A MULTIPLE NUMBER OF TOP ELECTRODES", where a multiple number of top electrodes may be deposited. For example, a multiple number of top electrodes may be deposited such that the multiple number of top electrodes are electrically coupled to the multiple number of nano-piezoelectric wires to form an array of nano-piezoelectric sensors. In some examples, the deposited multiple number of top electrodes may have a substantially parallel pattern.

In some examples, a layer of insulation material may be deposited on the multiple number of bottom electrodes prior to depositing the multiple number of top electrodes.

Processing may continue from operation 1708 to operation 1710, "DEPOSIT A MULTIPLE NUMBER OF FLEXIBLE MICRO BUMPS", where a multiple number of flexible micro bumps may be deposited on the array of nano-piezoelectric sensors. For example, a multiple number of flexible micro bumps may be deposited on the array of nano-piezoelectric sensors, where the multiple number of flexible micro bumps may be operably coupled to the array of nano-piezoelectric sensors.

In some examples, a top layer of flexible insulation material may be deposited on the multiple number of top electrodes prior to depositing the multiple number of flexible micro bumps. Additionally or alternatively, a static-charge screen material may be deposited on the top layer of flexible insulation, where the top layer of flexible insulation material and/or the static-charge screen material may be located between the multiple number of flexible micro bumps and the array of nano-piezoelectric sensors.

FIG. 18 illustrates an example computer program product 1800 that may be arranged in accordance with at least some examples of the present disclosure. Program product 1800 may include a signal bearing medium 1802. Signal bearing medium 1802 may include one or more machine-readable instructions 1804, which, if executed by one or more processors, may operatively enable a computing device to provide the functionality described above with respect to process 1500 of FIG. 15, process 1600 of FIG. 16, and/or process 1700 of FIG. 17. Thus, for example, one or more computing devices may undertake one or more of the actions shown in FIG. 15, FIG. 16, and/or FIG. 17 in response to instructions 1804 conveyed by medium 1802 to manufacture tactile devices including flexible micro bumps operably coupled to an array of nano-piezoelectric sensors.

In some implementations, signal bearing medium 1802 may encompass a non-transitory computer-readable medium 1806, such as, but not limited to, a hard disk drive, a Compact Disc (CD), a Digital Versatile Disk (DVD), a digital tape, memory, etc. In some implementations, signal bearing medium 1802 may encompass a recordable medium 1808, such as, but not limited to, memory, read/write (R/W) CDs, R/W DVDs, etc. In some implementations, signal bearing medium 1802 may encompass a communications medium 1810, such as, but not limited to, a digital and/or an analog communication medium (e.g., a fiber optic cable, a waveguide, a wired communications link, a wireless communication link, etc.).

Figure 19:
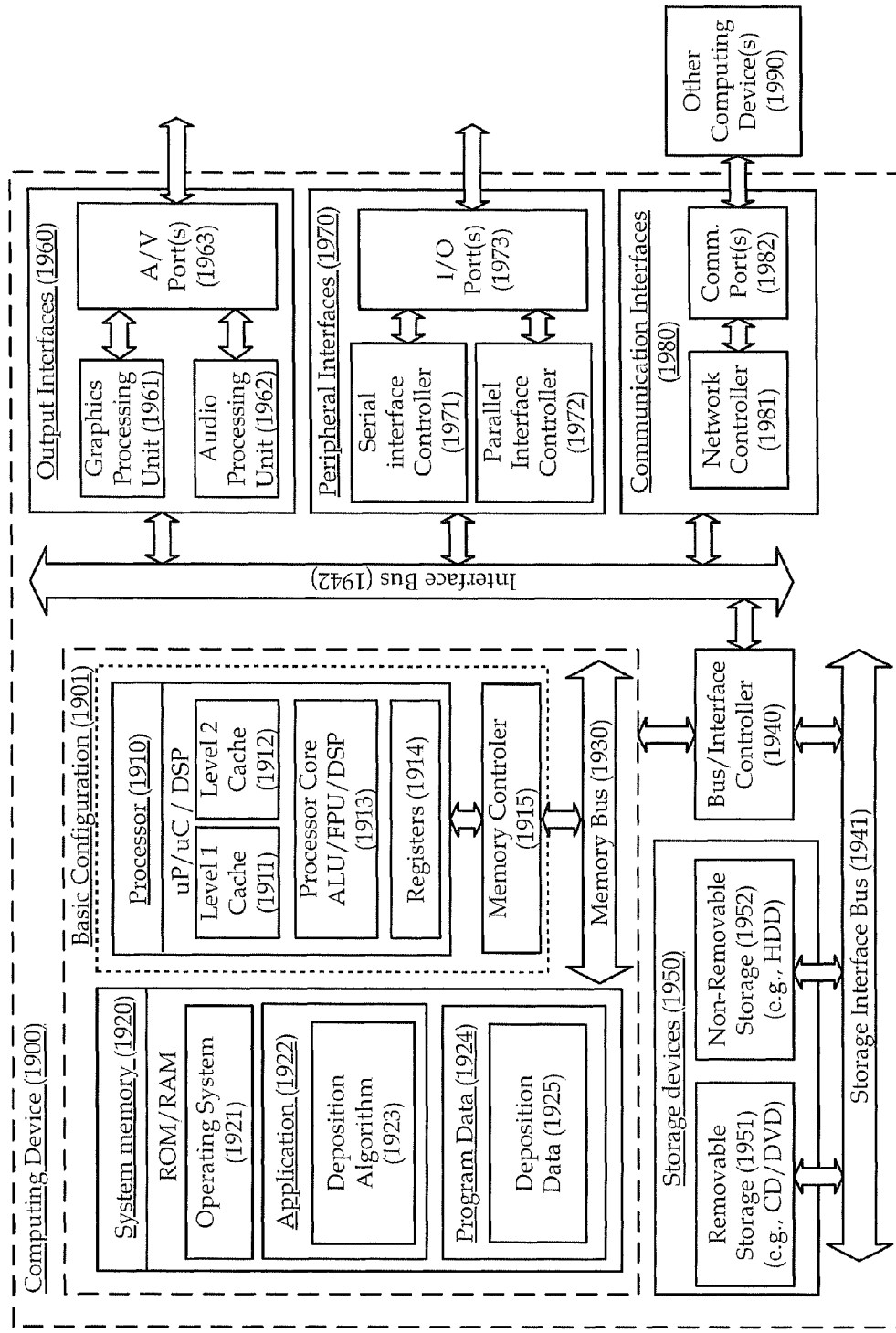
FIG. 19 is a block diagram illustrating an example computing device; all arranged in accordance with at least some embodiments of the present disclosure.
Figure 19:
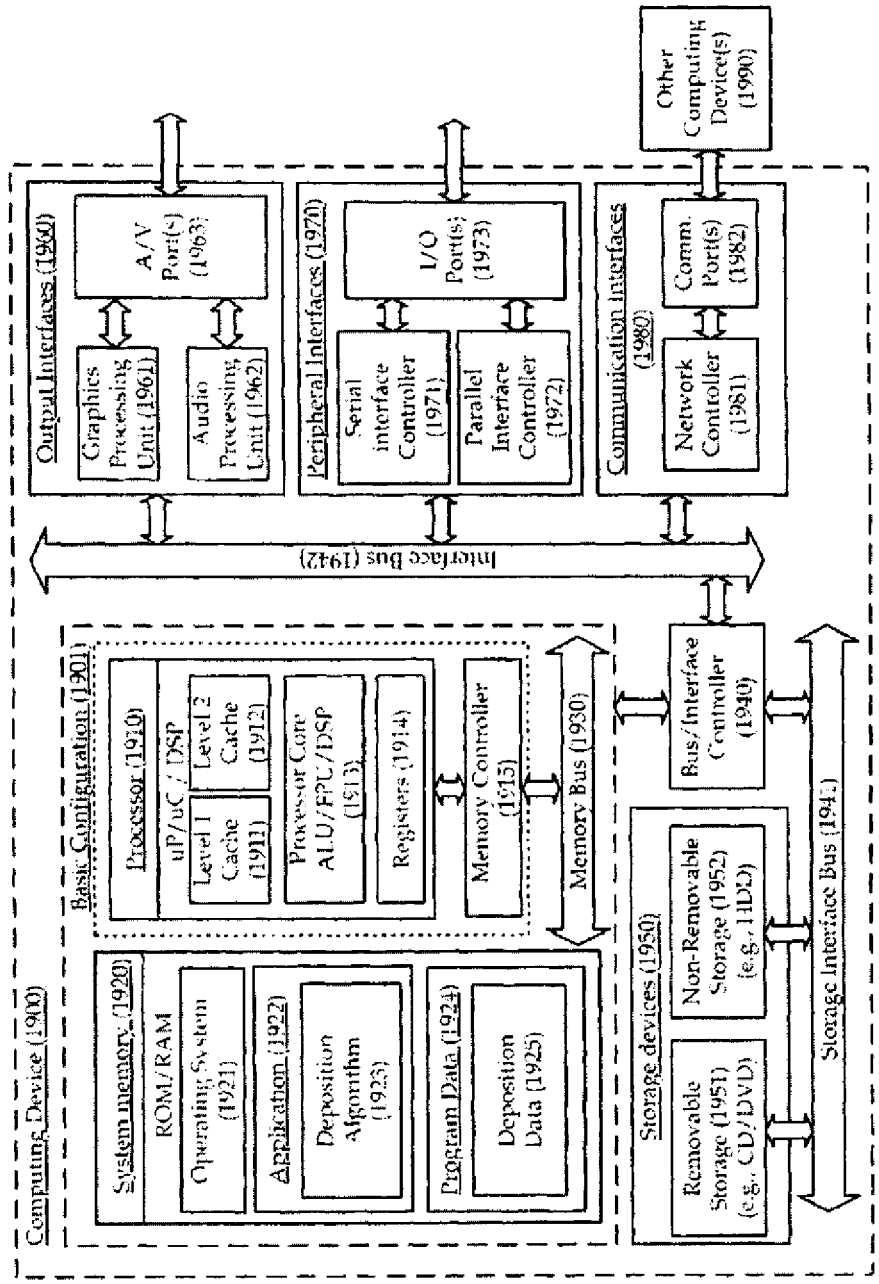

FIG. 19 is a block diagram illustrating an example computing device 1900, such as might be embodied by a person skilled in the art, which may be arranged in accordance with at least some embodiments of the present disclosure. In one example basic configuration 1901, computing device 1900 may include one or more processors 1910 and system memory 1920. A memory bus 1930 may be used for communicating between the processor 1910 and the system memory 1920.

Depending on the desired configuration, processor 1910 may be of any type including but not limited to a microprocessor (µP), a microcontroller (µC), a digital signal processor (DSP), or any combination thereof. Processor 1910 may include one or more levels of caching, such as a level one cache 1911 and a level two cache 1912, a processor core 1913, and registers 1914. The processor core 1913 may include an arithmetic logic unit (ALU), a floating point unit (FPU), a digital signal processing core (DSP Core), or any combination thereof. A memory controller 1915 may also be used with the processor 1910, or in some implementations the memory controller 1915 may be an internal part of the processor 1910.

Depending on the desired configuration, the system memory 1920 may be of any type including but not limited to volatile memory (such as RAM), non-volatile memory (such as ROM, flash memory, etc.) or any combination thereof. System memory 1920 may include an operating system 1921, one or more applications 1922, and program data 1924. Application 1922 may include a deposition algorithm 1923 for manufacturing tactile devices including flexible micro bumps operably coupled to an array of nano-piezoelectric sensors that is arranged to perform the functions as described herein including the functional blocks and/or actions described with respect to at least process 1500 of FIG. 15, process 1600 of FIG. 16, and/or process 1700 of FIG. 17. Program Data 1924 may include data 1925 for use with deposition algorithm 1923. In some example embodiments, application 1922 may be arranged to operate with program data 1924 on an operating system 1921 such that implementations of manufacturing tactile devices including flexible micro bumps operably coupled to an array of nano-piezoelectric sensors may be provided as described herein. For example, one or more computing devices 1900 may be capable of performing all or a portion of application 1922 such that implementations of manufacturing tactile devices sensors including flexible micro bumps operably coupled to an array of nano-piezoelectric sensors may be provided as described herein. This described basic configuration is illustrated in FIG. 19 by those components within dashed line 1901.

Computing device 1900 may have additional features or functionality, and additional interfaces to facilitate communications between the basic configuration 1901 and any required devices and interfaces. For example, a bus/interface controller 1940 may be used to facilitate communications between the basic configuration 1901 and one or more data storage devices 1950 via a storage interface bus 1941. The data storage devices 1950 may be removable storage devices 1951, non-removable storage devices 1952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 1920, removable storage 1951 and non-removable storage 1952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 1900. Any such computer storage media may be part of device 1900.

Computing device 1900 may also include an interface bus 1942 for facilitating communication from various interface devices (e.g., output interfaces, peripheral interfaces, and communication interfaces) to the basic configuration 1901 via the bus/interface controller 1940. Example output interfaces 1960 may include a graphics processing unit 1961 and an audio processing unit 1962, which may be configured to communicate to various external devices such as a display or speakers via one or more A/V ports 1963. Example peripheral interfaces 1970 may include a serial interface controller 1971 or a parallel interface controller 1972, which may be configured to communicate with external devices such as input devices (e.g., keyboard, mouse, pen, voice input device, touch input device, etc.) or other peripheral devices (e.g., printer, scanner, etc.) via one or more I/O ports 1973. An example communication interface 1980 includes a network controller 1981, which may be arranged to facilitate communications with one or more other computing devices 1990 over a network communication via one or more communication ports 1982. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 1900 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 1900 may also be implemented as a personal computer including both laptop computer and non-laptop computer configurations. In addition, computing device 1900 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are riot limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. An apparatus comprising:
    a flexible substrate;
    an array of nano-piezoelectric sensors operably coupled to the flexible substrate, wherein the array of nano-piezoelectric sensors comprises a layer of nano-piezoelectric wires; and
    a plurality of flexible micro bumps operably coupled to the array of nano-piezoelectric sensors.

2. The apparatus of claim 1, wherein the apparatus is configured to sense a pressure distribution and surface morphology through a static-type contact and/or sense a surface texture through a dynamic-type contact, wherein the pressure distribution and surface morphology and/or surface texture is based at least in part on frequency, amplitude, and polarity data from the array of nano-piezoelectric sensors.

3. The apparatus of claim 1, further comprising:
    a layer of flexible insulation material located between the nano-piezoelectric wires;
    a top layer of flexible insulation material; and
    a static-charge screen material, wherein the top layer of flexible insulation material and the static-charge screen material are located between the plurality of flexible micro bumps and the array of nano-piezoelectric sensors.

4. The apparatus of claim 1, wherein the nano-piezoelectric wires comprise one or more of the following materials: zinc oxide-type nano-wire, gallium nitride-type nano-wire, and/or lead zirconatetitanate-type nano-wire.

5. An article comprising:
    a signal bearing medium comprising machine-readable instructions stored thereon, which, if executed by one or more processors, operatively enable a computing device to:
        deposit a plurality of bottom electrodes on a flexible substrate, wherein the deposited plurality of bottom electrodes have a substantially parallel pattern;
        deposit a plurality of nano-piezoelectric wires on the flexible substrate, wherein the deposited plurality of nano-piezoelectric wires have a substantially checkerboard pattern;
        deposit a plurality of top electrodes such that the plurality of top electrodes are electrically coupled to the plurality of nano-piezoelectric wires to form an array of nano-piezoelectric sensors, wherein the deposited plurality of top electrodes have a substantially parallel pattern; and
        deposit a plurality of flexible micro bumps on the array of nano-piezoelectric sensors, wherein the plurality of flexible micro bumps are operably coupled to the array of nano-piezoelectric sensors.

6. The article of claim 5, wherein the plurality of nano-piezoelectric wires comprise one or more of the following materials: zinc oxide-type nano-wire, gallium nitride-type nano-wire, and/or lead zirconatetitanate-type nano-wire.

7. A method, comprising:
    depositing a plurality of nano-piezoelectric wires on a flexible substrate, wherein the deposited plurality of nano-piezoelectric wires have a substantially parallel pattern;
    removing portions of the deposited plurality of nano-piezoelectric wires to form substantially checkerboard pattern;
    depositing a plurality of bottom electrodes on the flexible substrate in electrical contact with the nano-piezoelectric wires, wherein the deposited plurality of bottom electrodes have a substantially parallel pattern;
    depositing a plurality of top electrodes such that the plurality of top electrodes are electrically coupled to the plurality of nano-piezoelectric wires to form an array of nano-piezoelectric sensors, wherein the deposited plurality of top electrodes have a substantially parallel pattern; and
    depositing a plurality of flexible micro bumps on the array of nano-piezoelectric sensors, wherein the plurality of flexible micro bumps are operably coupled to the array of nano-piezoelectric sensors.

8. A method, comprising:
    depositing a plurality of bottom electrodes on a flexible substrate, wherein the deposited plurality of bottom electrodes have a substantially parallel pattern;
    depositing a plurality of nano-piezoelectric wires on the flexible substrate, wherein the deposited plurality of nano-piezoelectric wires have a substantially checkerboard pattern;
    depositing a plurality of top electrodes such that the plurality of top electrodes are electrically coupled to the plurality of nano-piezoelectric wires to form an array of nano-piezoelectric sensors, wherein the deposited plurality of top electrodes have a substantially parallel pattern; and
    depositing a plurality of flexible micro bumps on the array of nano-piezoelectric sensors, wherein the plurality of flexible micro bumps are operably coupled to the array of nano-piezoelectric sensors.

9. The method of claim 8, further comprising:
    depositing a layer of catalyst on the substrate prior to depositing the nano-piezoelectric wires, wherein the deposited layer of catalyst has a substantially checkerboard pattern; and
    wherein depositing the plurality of nano-piezoelectric wires on the substrate comprises depositing the plurality of nano-piezoelectric wires on the layer of catalyst, wherein the plurality of nano-piezoelectric wires have a perpendicular orientation with respect to the substrate.

10. The method of claim 8, further comprising depositing a layer of flexible insulation material between the plurality of nano-piezoelectric wires prior to depositing the plurality of top electrodes.

11. The method of claim 8, further comprising:
    depositing a top layer of flexible insulation material on the plurality of top electrodes prior to depositing the plurality of flexible micro bumps; and
    depositing a static-charge screen material on the top layer of flexible insulation material, wherein the top layer of flexible insulation material and the static-charge screen material are located between the plurality of flexible micro bumps and the array of nano-piezoelectric sensors.

12. The method of claim 8, further comprising:
depositing a layer of catalyst on the substrate prior to depositing the nano-piezoelectric wires, wherein the deposited layer of catalyst has a substantially checkerboard pattern;
wherein depositing the plurality of nano-piezoelectric wires on the substrate comprises depositing the plurality of nano-piezoelectric wires on the layer of catalyst, wherein the plurality of nano-piezoelectric wires have a perpendicular orientation with respect to the substrate;
depositing a layer of flexible insulation material between the plurality of nano-piezoelectric wires prior to depositing the plurality of top electrodes;
depositing a top layer of flexible insulation material on the plurality of top electrodes prior to depositing the plurality of flexible micro bumps; and
depositing a static-charge screen material on the top layer of flexible insulation material, wherein the top layer of flexible insulation material and the static-charge screen material are located between the plurality of flexible micro bumps and the array of nano-piezoelectric sensors.

13. The method of claim 8, wherein the flexible substrate comprises one or more of the following materials: polyimide, polyester, polyethylene terephthalate, polyethylene naphthalate, aramid, poly(dimethylsiloxane), epoxy, and/or liquid crystal polymer.

14. The method of claim 8, wherein the plurality of nano-piezoelectric wires comprise one or more of the following materials: zinc oxide-type nano-wire, gallium nitride-type nano-wire, and/or lead zirconatetitanate-type nano-wire.

15. The method of claim 8, wherein the plurality of flexible micro bumps form an uneven surface, and wherein individual micro bumps comprise a semi-circular-type shape and/or a semi elliptical-type shape.

16. The method of claim 8, wherein the array of nano-piezoelectric sensors is configured to sense a pressure distribution and surface morphology through a static-type contact and/or sense a surface texture through a dynamic-type contact, wherein the pressure distribution and surface morphology and/or surface texture is based at least in part on frequency, amplitude, and polarity data from the array of nano-piezoelectric sensors.

17. The method of claim 7, further comprising depositing a layer of insulation material on the plurality of bottom electrodes prior to depositing the plurality of top electrodes.

18. The method of claim 7, further comprising:
depositing a top layer of flexible insulation material on the plurality of top electrodes prior to depositing the plurality of flexible micro bumps; and
depositing a static-charge screen material on the top layer of flexible insulation material, wherein the top layer of flexible insulation material and the static-charge screen material are located between the plurality of flexible micro bumps and the array of nano-piezoelectric sensors.

19. The method of claim 7, wherein the plurality of nano-piezoelectric wires comprise one or more of the following materials: zinc oxide-type nano-wire, gallium nitride-type nano-wire, and/or lead zirconatetitanate-type nano-wire.

20. The method of claim 7, wherein the plurality of flexible micro bumps form an uneven surface, and wherein individual micro bumps comprise a semi-circular type shape and/or a semi elliptical-type shape.

21. The method of claim 7, wherein the array of nano-piezoelectric sensors is configured to sense a pressure distribution and surface morphology through a static-type contact and/or sense a surface texture through a dynamic-type contact, wherein the pressure distribution and surface morphology and/or surface texture is based at least in part on frequency, amplitude, and polarity data from the array of nano-piezoelectric sensors.

* * * * *

UNITED STATES PATENT AND TRADEMARK OFFICE
CERTIFICATE OF CORRECTION

Page 1 of 2

PATENT NO. : 8,749,120 B2
APPLICATION NO. : 13/580945
DATED : June 10, 2014
INVENTOR(S) : Liu et al.

It is certified that error appears in the above-identified patent and that said Letters Patent is hereby corrected as shown below:

In the Drawings

Delete Drawing Sheet 19 of 19 and substitute therefor with the attached Drawing Sheet 19 of 19.
FIG. 19 has been corrected.

In the Specification

In Column 4, Line 38, delete "flexible substrate 100." and insert -- flexible substrate 102. --, therefor.

In Column 6, Line 30, delete "polydirnethylsiloxane" and insert -- polydimethylsiloxane --, therefor.

In Column 7, Line 48, delete "Chem," and insert -- Chem. --, therefor.

In Column 17, Line 17, delete "riot" and insert -- not --, therefor.

Signed and Sealed this
Twenty-seventh Day of January, 2015

Michelle K. Lee
*Deputy Director of the United States Patent and Trademark Office*